US012707694B2

(12) United States Patent
Ellingwood et al.

(10) Patent No.: US 12,707,694 B2
(45) Date of Patent: Aug. 11, 2026

(54) INTEGRATED CIRCUIT WITH SILICIDE FORMATION BLOCKING

(71) Applicant: Texas Instruments Incorporated, Dallas, TX (US)

(72) Inventors: Brian Ellingwood, Millcreek, UT (US); Monte Nettles, Lehi, UT (US); Jeffrey S. Hansen, West Jordan, UT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 355 days.

(21) Appl. No.: 18/525,837

(22) Filed: Nov. 30, 2023

(65) Prior Publication Data

US 2025/0183039 A1 Jun. 5, 2025

(51) Int. Cl.

*H10D 64/01* (2025.01)
*H10D 1/47* (2025.01)
*H10P 14/60* (2026.01)
*H10P 14/694* (2026.01)

(52) U.S. Cl.

CPC ........... *H10D 64/0112* (2026.01); *H10D 1/47* (2025.01); *H10P 14/6336* (2026.01); *H10P 14/6529* (2026.01); *H10P 14/69433* (2026.01)

(58) Field of Classification Search

None

See application file for complete search history.

(56) References Cited

U.S. PATENT DOCUMENTS

2005/0009337 A1* 1/2005 Liu .................... H10D 64/0112 438/682
2006/0014387 A1* 1/2006 Robertson ............. H10D 1/474 438/682
2015/0332963 A1* 11/2015 Wu .................... H10W 20/057 438/668
2023/0299168 A1* 9/2023 Hu .................... H10D 30/6219
2024/0038580 A1* 2/2024 Yang ................. H10W 10/0143

* cited by examiner

*Primary Examiner* — Alexander G Ghyka

(74) *Attorney, Agent, or Firm* — Andrew R. Ralston; Frank D. Cimino

(57) ABSTRACT

A method of forming an integrated circuit by forming a first silicon surface, forming a second silicon surface, forming a first silicide blocking layer along the first silicon surface and along the second silicon surface, and forming a second silicide blocking layer along the first silicide blocking layer. The forming of each of the first silicide blocking layer and the second silicide blocking layer includes forming a plasma enhanced chemical vapor deposition (PECVD) layer and exposing the PECVD layer to a noble gas for a time duration. Thereafter, the method removes a portion of the second silicide blocking layer and an underlying portion of the first silicide blocking layer to expose the first silicon surface while leaving at least the first silicide blocking layer over the second silicon surface and silicides the first silicon surface.

15 Claims, 12 Drawing Sheets

INTEGRATED CIRCUIT WITH SILICIDE FORMATION BLOCKING

CROSS-REFERENCE TO RELATED APPLICATION

This application relates to U.S. Provisional Application No. 63/604,137, filed Nov. 29, 2023, and which is fully incorporated herein by reference.

TECHNICAL AREA

Described examples relate to integrated circuit (IC) and fabrication, and more particularly, but not exclusively, to an IC that includes a silicide formation blocking structure and/or methodology.

BACKGROUND

A silicide combines silicon and another element, typically a metal, often to form the metal silicide as a conductive layer in an IC. Silicides may be used in many locations in metal-oxide-semiconductor (MOS) devices, such as in MOS field-effect transistors (MOSFETs), for example on any of a polysilicon gate or transistor source/drain regions. Silicides also may be formed on IC polysilicon resistors. Silicides are sometimes formed in selective locations, where selectivity is achieved by forming a blocking structure (or barrier) on certain silicon surfaces while leaving other surfaces exposed, so that subsequent silicide formation only occurs on the exposed surfaces. The blocking structure may be referred to as a silicide block, which may be abbreviated as SiBLK.

In some approaches, a SiBLK is formed by depositing bis(tert-butylamino) silane (BTBAS) nitride in a furnace. BTBAS SiBLK formation may provide certain benefits, for example including a relatively high resistance to a subsequent hydrofluoric (HF) acid etch and acceptable levels of surface conformality. Conversely, BTBAS SiBLK may have various drawbacks, for example, relatively large expense, exceedingly care-requiring chemistry, and lengthy and/or high heating requirements that may negatively impact other IC structures. While the preceding may have implementation in various baseline devices, this document provides examples that may improve on certain of the above concepts, as detailed below.

SUMMARY

In an example, there is a method of forming an integrated circuit. The method comprises, forming a first silicon surface, forming a second silicon surface, forming a first silicide blocking layer along the first silicon surface and along the second silicon surface, and forming a second silicide blocking layer along the first silicide blocking layer. The forming of each of the first silicide blocking layer and the second silicide blocking layer includes forming a plasma enhanced chemical vapor deposition (PECVD) layer and exposing the PECVD layer to a noble gas for a time duration. Thereafter, the method removes a portion of the second silicide blocking layer and an underlying portion of the first silicide blocking layer to expose the first silicon surface while leaving at least the first silicide blocking layer over the second silicon surface, and siliciding the first silicon surface.

Other aspects are also described and claimed.

DETAILED DESCRIPTION

Figure 1:
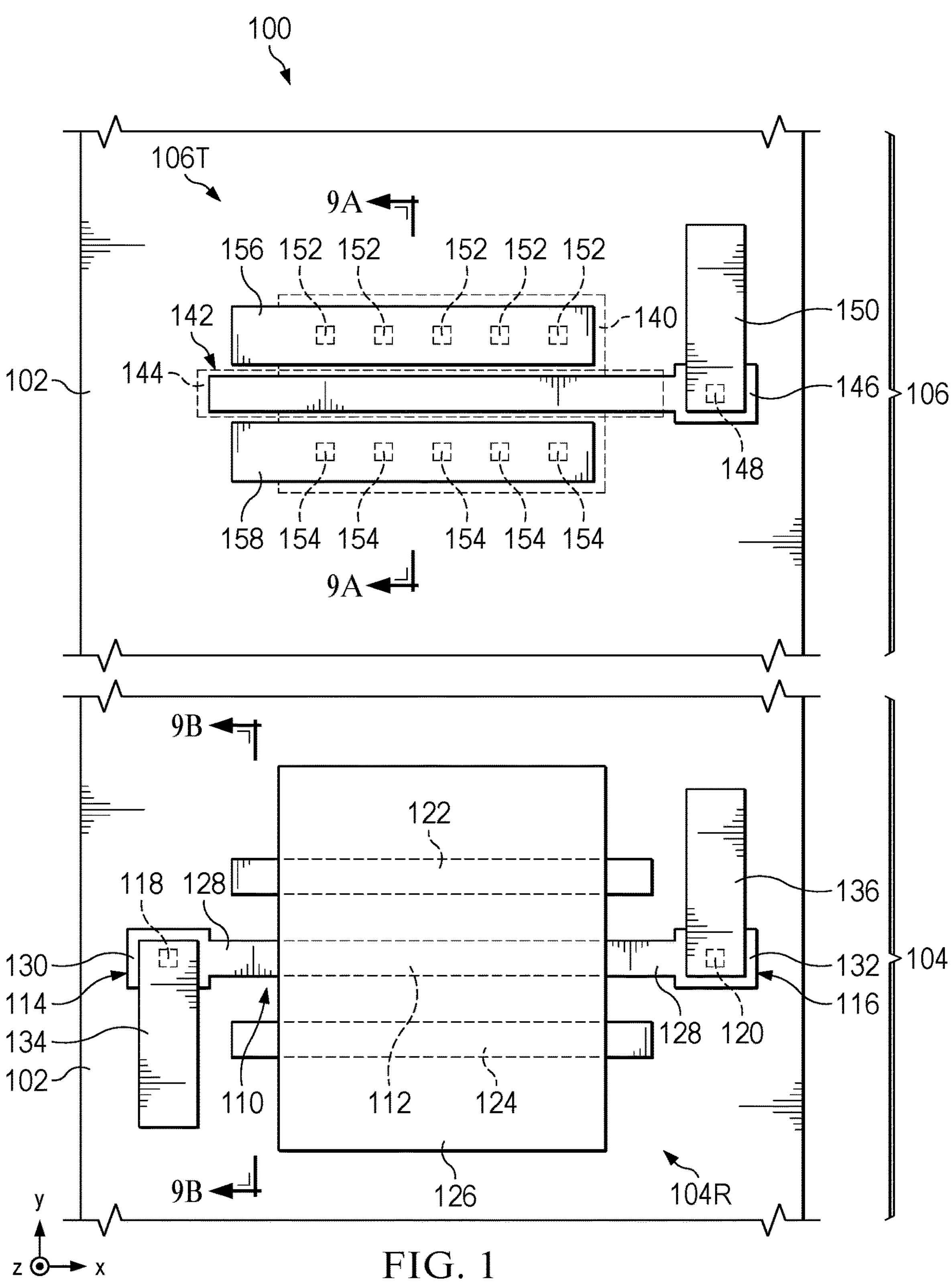
FIG. 1 is a plan and partial view of a semiconductor device, as part of an example including a resistor 104R and transistor 106T.

Examples are described with reference to the attached figures. The figures are provided to illustrate the examples and may not be drawn to scale. Several aspects are described with reference to example applications for illustration, in which like features correspond to like reference numbers. In FIG. 1 and various later figures, two or more dimensions are shown and indicated in an x-y-z coordinate space, where in FIG. 1 a plan view is shown in the x-y plane but should be understood to also have features in the z-dimension, understood to be extending in a direction out of the illustrated image plane. The directional references are for purposes of relative placement, but such terms are not intended to be restrictive as the device may be rotated in space and thereby change absolute, but not relative, references. Numerous specific details, relationships, and methods are set forth to provide an understanding, but the scope is not necessarily limited by the illustrated ordering of acts or events, as some acts may occur in different orders and/or concurrently with other acts or events. Further, not all illustrated acts or events may be required to implement a methodology in accordance with one or more examples.

The examples relate to semiconductor integrated circuit (IC) fabrication, and more particularly but not exclusively to an IC that includes plural silicon surfaces, at least one of which that is eventually silicided while another of which is blocked from silicidation. For example, IC fabrication of plural devices on a same substrate, such as resistors and transistors, where portions of the resistor body, and one or more surfaces of the transistors, may provide the above-described plural silicon surfaces. This document provides examples that may improve on certain of the above concepts, as detailed below. While such examples may be expected to provide various advantages as described above, no particular result is a requirement unless explicitly recited in a particular claim.

FIG. 1 is a plan and partial view of a semiconductor device 100, e.g. a portion of an IC. The semiconductor device 100 includes a semiconductor substrate 102, for example as part of a silicon wafer. Such a wafer typically includes multiple locations, each corresponding to a same or different IC on the wafer, so the illustration of FIG. 1 (and later figures) can be repeated in each wafer IC location. The wafer typically provides either a p-type or n-type semiconductor, and the semiconductor substrate 102 can represent a portion of the bulk wafer or a region (e.g., a well and/or buried layer and/or epitaxial layer) formed in connection with the wafer. As detailed in the remaining figures, a resistor area 104 and an active device area—shown by example as a transistor area 106—are provided, into which are ultimately formed examples of a respective resistor 104R and transistor 106T, in connection with the semiconductor substrate 102. The resistor 104R and transistor 106T are represented by certain general features and corresponding areas in FIG. 1, with additional details, options, and attributes described later. Ultimately, the figures and corresponding descriptions provide examples that may provide one or more benefits, such as selective silicidation of such structures with potential improvements in acceptable levels of any one or more of sufficient resistance to varying HF wet etch rates, SiBLK conformality, particle defectivity, chemical cost, and thermal budget.

The resistor 104R includes a polysilicon structure 110 (e.g., of polysilicon or polysilicon germanium) with a major axis in the x-dimension. The polysilicon structure 110 includes a polysilicon resistor body 112 and opposing first and second ends 114 and 116. The polysilicon resistor body 112 may have a length from 0.2 μm to 100 μm and a width (in the y-dimension) in a range from 0.03 μm to 50 μm. Indeed, as the width tends toward the lower values in this range, one or more benefits described later may be achieved. Each of the ends 114 and 116 has a length (in the x-dimension) that may range from 0.03 μm to 0.25 μm and a width (in the y-dimension) that may range from 0.03 μm to 50 μm. Note that the width of ends 114 and 116 is shown as greater than the width of the polysilicon resistor body 112, where the greater end width may be implemented to accommodate the size of contacts 118 and 120, further described below. Also for example, in the same steps that form the polysilicon structure 110, also formed from a same polysilicon layer, for example by appropriate masking and etching, are one or more dummy polysilicon features 122 and 124, for example parallel to, and equally opposed and spaced from, respective sidewalls of the polysilicon resistor body 112. Each of the dummy polysilicon features 122 and 124 may have a same width, which may be slightly smaller than that of the polysilicon resistor body 112. The dummy polysilicon features 122 and 124 are not functional as part of the resistance achieved through the resistor 104R per se, but may be implemented as part of good or best practices as width control for the polysilicon resistor body 112, for example in influencing a plasma etch of the polysilicon material that results in the polysilicon resistor body 112.

The polysilicon resistor body 112 and its ends 114 and 116 generally provide the resistance of the resistor 104R, and that resistance is accessible by various conductive structures. For example, a SiBLK 126 is formed over a majority of the exposed x/y plane area of the polysilicon resistor body 112 (and likewise of the dummy polysilicon features 122 and 124). After the SiBLK 126 is formed, various silicide regions are formed, for example by siliciding exposed (not blocked by the SiBLK 126) polysilicon, thereby resulting in a body silicide 128 over exposed portions of the polysilicon resistor body 112, and first and second end silicides 130 and 132 over the first and second ends 114 and 116, respectively. Accordingly, in the x-y plane, the resistor 104R has an upper surface that is only partially silicided, for example, with silicide covering a range of 0.2 to 70 percent of the x/y plane area of the resistor 104R, with the remainder unsilicided, between the first and second ends 114 and 116. After the silicides are formed, the conductive contacts 118 and 120 are formed. Each of the conductive contacts 118 and 120 extends, in the z-dimension, to a respective one of the first and second end silicides 130 and 132. The contacts 118 and 120 electrically conduct to, and also may be part of, respective metal layer portions 134 and 136, which may extend far greater in the y-dimension than as shown in FIG. 1. Accordingly, a resistance provided by the resistor 104R may be electrically accessed by coupling to each of the metal layer portions 134 and 136.

The transistor 106T includes a moat 140, shown by a dotted line to represent it is an intended area in which transistor source/drain regions are formed on opposing sides of a transistor gate 142, as further described below. The moat 140 may include one or more doped regions, typically all of a same conductivity type but potentially of different dopant concentrations. For example, the semiconductor substrate 102 may be of a first conductivity type (e.g., p-type), and the moat 140 may include a conductivity type (e.g., n-type) that is opposite of, or complementary to, the conductivity type of the semiconductor substrate 102. Other alternatives or variations are understood in the art (e.g., buried layers, epitaxial layers, wells, and the like). As detailed in co-assigned U.S. application Ser. No. 18/345,873, entitled ZERO TEMPCO RESISTOR WITH SELECTIVE DOPING, filed Jun. 30, 2023, and Ser. No. 18/345,833, entitled ZERO TEMPCO RESISTOR, and filed Jun. 30, 2023, both of which are fully incorporated herein by reference, in some examples, a same dopant implant also may be introduced into both the moat 140 and portions, or all, of the resistor 104R polysilicon structure 110, concurrently with, or without, a non-dopant co-implant species (e.g., carbon, nitrogen).

The transistor gate 142 includes a polysilicon transistor gate 144 that is enclosed in a dotted perimeter in FIG. 1, as the polysilicon transistor gate 144 is not directly visible in the FIG. 1 perspective. Specifically, the FIG. 1 perspective illustrates that the polysilicon transistor gate 144 is covered by a gate silicide 146, formed above (in the z-dimension) the polysilicon transistor gate 144. In an example, the polysilicon transistor gate 144 is formed in the same polysilicon formation/masking, and etch step(s) as is the resistor 104R polysilicon structure 110.

Various regions of the transistor 106T are accessible by various conductive structures. For example, at the same time the gate silicide 146 is formed, source/drain silicides may be formed within the perimeter of the moat 140, but are not visible in FIG. 1 as they are below other illustrated structures. Particularly, after the gate silicide 146 is formed, a conductive contact 148 is formed to extend in the z-dimension, for example to one end of the polysilicon transistor gate 144/gate silicide 146 that reaches beyond the x/y perimeter of the moat 140. The conductive contact 148 electrically conducts to, and also may be part of, a metal layer portion 150. Similarly, a first conductor set 152, including one or more conductive contacts, is formed on a first side of the polysilicon transistor gate 144 and downward in the z-dimension to a first source/drain silicide, again not visible in FIG. 1 (see 902, FIG. 9A). And, a second conductor set 154, including one or more conductive contacts, is formed on a second side, opposite the first side, of the polysilicon transistor gate 144 and downward in the z-dimension to a second source/drain silicide, again not visible in FIG. 1 (see 904, FIG. 9A). Accordingly, the first conductor set 152 may electrically communicate with a first source/drain region (see 506, FIG. 5) in the moat 140, and the second conductor set 154 may electrically communicate with a second source/drain region (see 508, FIG. 5) in the moat 140. Lastly, the first conductor set 152 conducts to, and also may be part of, a metal layer portion 156, and the second conductor set 154 conducts to, and also may be part of, a metal layer portion 158.

Figures 2, 3:
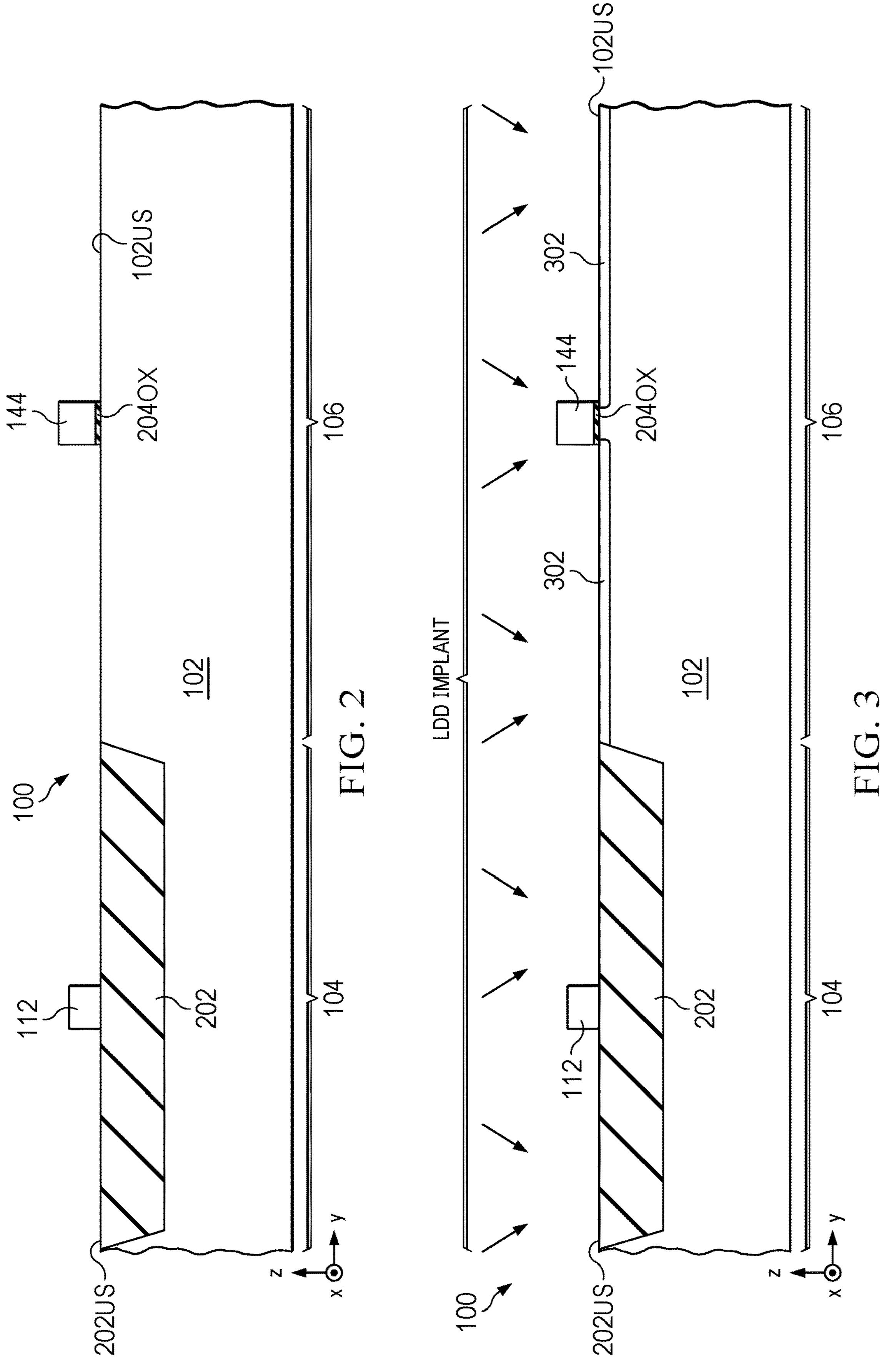
FIGS. 2 through 6, 7A, 7B, and 7C, and 8 are cross-section views representing successive fabrication stages and resultant structures of the FIG. 1 semiconductor structure.

FIGS. 2 through 9B are cross-sectional views, for example in the –x-dimension (y-z plane) across FIG. 1, representing successive fabrication stages and resultant structures of the FIG. 1 semiconductor device 100. However, for sake of simplifying the illustration and description, the FIG. 1 dummy polysilicon features 122 and 124 are not shown. In FIG. 2, the semiconductor device 100 is provided at an early manufacturing stage. The semiconductor device 100 includes the semiconductor substrate 102, for example as part of a silicon wafer. Such a wafer typically includes multiple locations, each corresponding to a same or different IC on the wafer, so the illustration of FIG. 2 (and later figures) can be repeated in each wafer IC location. The wafer typically provides either a p-type or n-type semiconductor, and the semiconductor substrate 102 can represent a portion of the bulk wafer or a region (e.g., a well, buried layer or epitaxial layer) formed in connection with the wafer. As introduced above, and detailed in the remaining figures, the semiconductor substrate 102 includes the resistor area 104 and the transistor area 106, into which are ultimately formed examples of the resistor 104R and the transistor 106T, respectively. Ultimately, these figures, and the corresponding descriptions, provide for any one or more of certain benefits in connection with silicide blocking for selective silicidation.

FIG. 2 illustrates the polysilicon resistor body 112 and the polysilicon transistor gate 144. Prior to formation of those structures, a surface isolation structure 202, for example a shallow trench isolation (STI) structure, is formed in a portion of an upper surface 102US of the semiconductor substrate 102, corresponding to the resistor area 104. The surface isolation structure 202 is shown for example as an STI structure having a thickness in a range of 150 nm to 600 nm, and it may later conductively isolate the resistor 104R from the substrate 102. Alternative isolation methods also may be used, such as a different insulator, a local oxidation of silicon (LOCOS) structure, or a doped well region. Thereafter, a threshold voltage (Vt) implant may be applied to the semiconductor substrate 102, with dopant type and energy selected to ultimately adjust the Vt of the transistor 106T, while the surface isolation structure 202 essentially blocks the implant dopants in the substrate 102 from having an effect on the resistor in the resistor area 104.

FIG. 2 also illustrates a gate oxide 2040X, formed from an oxide layer (not fully shown) that was previously formed across a portion of the upper surface 102US, for example where the surface isolation structure 202 is not located and by oxidizing the remaining exposed portion of the upper surface 102US. The gate oxide 2040X forming layer may have a thickness from 1 nm to 5 nm. Thereafter, a polysilicon layer is deposited atop the entire illustrated structure, thereby conforming to the gate oxide 2040X forming layer and an upper surface 202US of the surface isolation structure 202. The polysilicon layer may be undoped when deposited, or may be in situ doped and/or doped by implant in some examples, and it is patterned and etched to form the polysilicon resistor body 112 and the polysilicon transistor gate 144.

In FIG. 3, a relatively light dopant implant, commonly referred to as a lightly doped drain (LDD) implant, is performed, forming corresponding LDD regions 302 below the upper surface 102US and that self-align to the gate oxide 2040X (and, at one end of the transistor 106T, also self-aligning to a lateral edge of the surface isolation structure 202). The LDD implant is typically provided at an energy lower than either an NSD or PSD implant, and it is selected of a dopant type corresponding to the desired conductivity type of the transistor 106T. For example, for an n-type metal oxide-semiconductor (NMOS) transistor, the LDD implant is of n-type dopants (e.g., arsenic, boron, and/or indium pocket implants, with an optional germanium pre-amorphizing implant (PAI)), for example with arsenic at an energy in a range from 1 keV to 2 keV and with a dose in a range of 2e14 to 2e15 atoms/cm$^2$, boron at an energy in a range from 3 keV to 12 keV and with a dose in a range of 1e13 to 1e14 atoms/cm$^2$ and with a 0 to 35 degree tilt with two or four rotations, and/or indium at an energy in a range from 10 keV to 45 keV with a dose in a range of 1e13 to 1e14 atoms/cm$^2$ and with a 0 to 35 degree tilt with two or four rotations. As an alternative example, for a p-type metal oxide-semiconductor (PMOS) transistor, the LDD implant is of p-type dopants (e.g., $BF_2$ (difluoroboron), boron, and/or indium or germanium PAI) for example with fluorine at an energy in a range from 1 keV to 5 keV and with a dose in a range of 1e14 to 4e15 atoms/cm$^2$, $BF_2$ at an energy in a range from 1 keV to 5 keV and with a dose in a range of 5e14 to 5e15 atoms/cm$^2$, boron at an energy in a range from 0.3 keV to 2 keV and with a dose in a range of 5e14 to 5e15 atoms/cm$^2$, and/or indium PAI at an energy in a range from 2 keV to 15 keV with a dose in a range of 1e13 to 5e14 atoms/cm$^2$ or a germanium PAI at an energy in a range from 5 keV to 20 keV with a dose in a range of 1e13 to 5e14 atoms/cm$^2$. The PMOS LDD also may include an arsenic/antimony pocket implant in a range from 20 keV to 60 keV with a dose in a range of 1e13 to 1e14 atoms/cm$^2$ or a phosphorous pocket implant in a range from 10 keV to 40 keV with a dose in a range of 1e13 to 1e14 atoms/cm$^2$. During the LDD implant, the polysilicon resistor body 112 (and entire polysilicon structure 110) may or may not be masked, based on a desired outcome for the resistor 104R. If the resistor body 112 (and polysilicon structure 110) is unmasked, ultimately the resistor 104R may have the same dopant type, as far as the majority of dopants is concerned, as the LDD implant, for example, if the LDD implant is n-type (sometimes referred to as NLDD), then the resistor 104R also may be n-type or, in complementary fashion, if the LDD implant is p-type (sometimes referred to as PLDD), then the resistor 104R also may be p-type.

Figure 4:
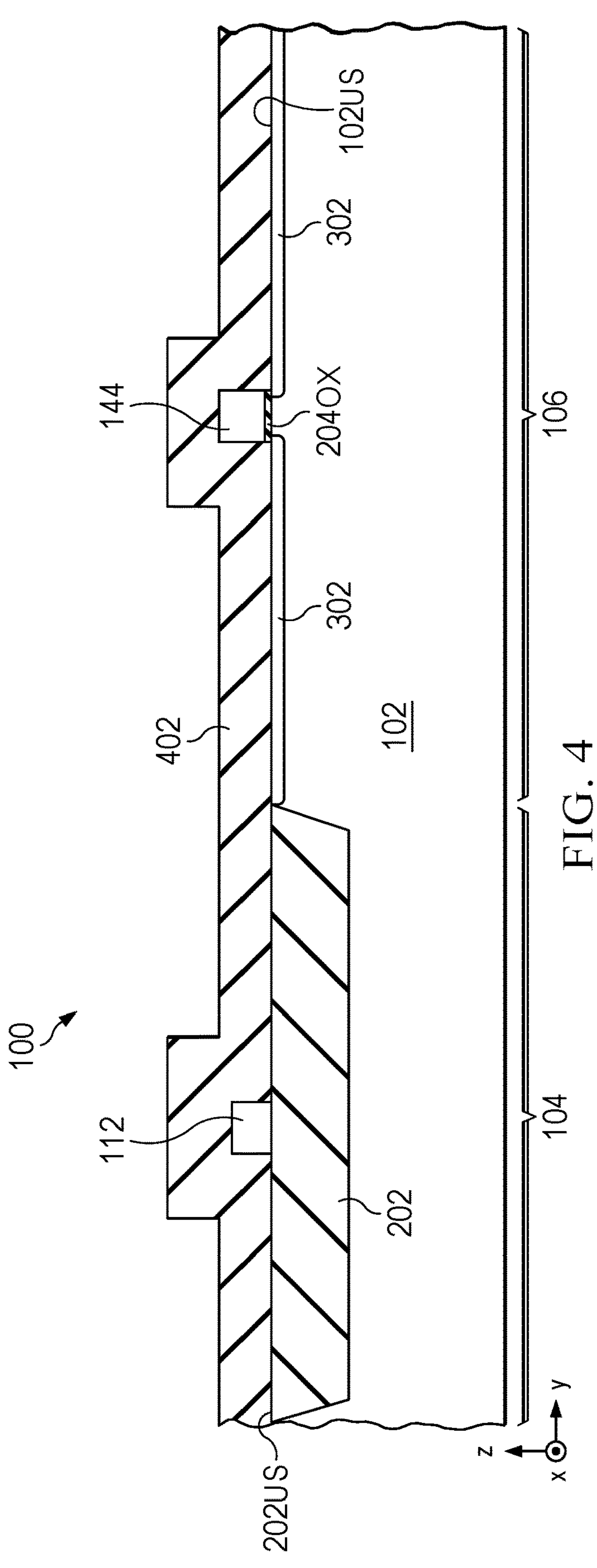

In FIG. 4, a layer 402 (or multiple separate layers) is formed over the FIG. 3 structure, in preparation to form alignment spacers in a later manufacturing stage. In the illustrated example, there is a single layer 402, but other examples are contemplated (for example, there are three such layers in co-assigned U.S. patent application Ser. No. 17/714,990, filed Apr. 6, 2022, entitled “Advanced Poly Resistor and CMOS Transistor”, which is hereby fully incorporated herein by reference). The layer 402 may be formed from a dielectric material, such as oxide or nitride, or again from multiple layers, selected for example from oxide or nitride. The layer 402 may have a total thickness from 10 nm to 120 nm, by ways of example.

Figure 5:
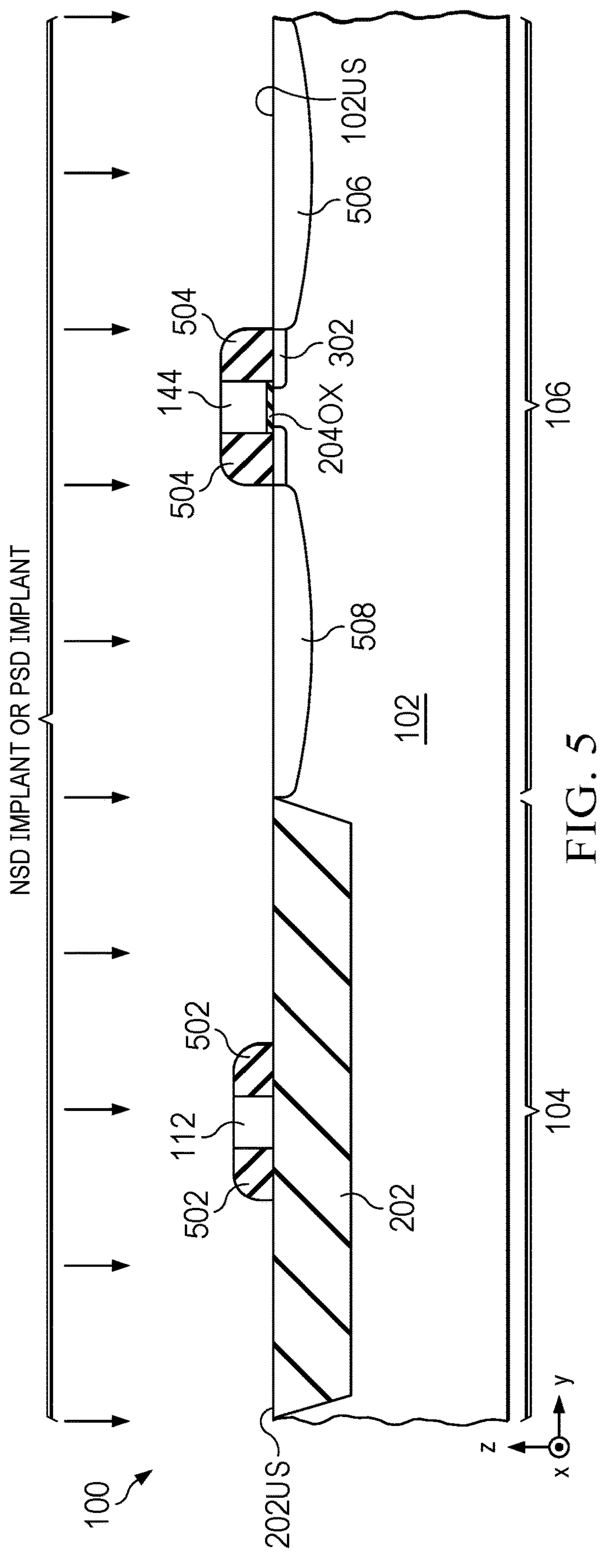

In FIG. 5, the FIG. 4 layer 402 is blanket etched down to the upper surfaces 102US and 202US, thereby forming a respective spacer 502 for the polysilicon resistor body 112 and a spacer 504 for the polysilicon transistor gate 144. Each of the spacers 502 and 504 includes a portion of the FIG. 4 layer 402 (or a portion from one or more of its layers, if the layer 402 includes plural layers). After the spacer 504 is formed, a source/drain dopant implant is performed. In the transistor area 106, the source/drain implant forms corresponding first and second transistor source/drain regions 506 and 508 below the upper surface 102US, and that self-align to the spacer 504 (and, for the first source/drain region 506, also to the surface isolation structure 202). In the resistor area 104, the source/drain implant provides the selected dopant(s) into the polysilicon structure 110, including the illustrated polysilicon resistor body 112. The source/drain implant may be of n-type (referred to as NSD) or p-type (referred to as PSD) and is selected of a dopant type corresponding to the desired conductivity type of the transistor 106T. As an example for an NSD implant, a combination of arsenic and phosphorus dopants are used, with arsenic at an energy from 5 keV to 35 keV, and with a dose in a range of 5e14 to 5e15 atoms/$cm^2$, and with phosphorous at an energy from 1 keV to 10 keV, and with a dose in a range of 5e14 to 5e15 atoms/$cm^2$. As an example for a PSD implant, a boron dopant is used at an energy from 1 keV to 10 keV, and with a dose in a range of 5e14 to 1e16 atoms/$cm^2$, with the option of adding an indium PAI, at an energy from 2 keV to 20 keV, and with a dose in a range of 5e13 to 5e14 atoms/$cm^2$. The implant also is at a relatively high concentration, for example yielding an initial average dopant concentration of 1e19/$cm^3$ to 6e21/$cm^3$ in the polysilicon transistor gate 144 and the polysilicon resistor body 112.

Figure 6:
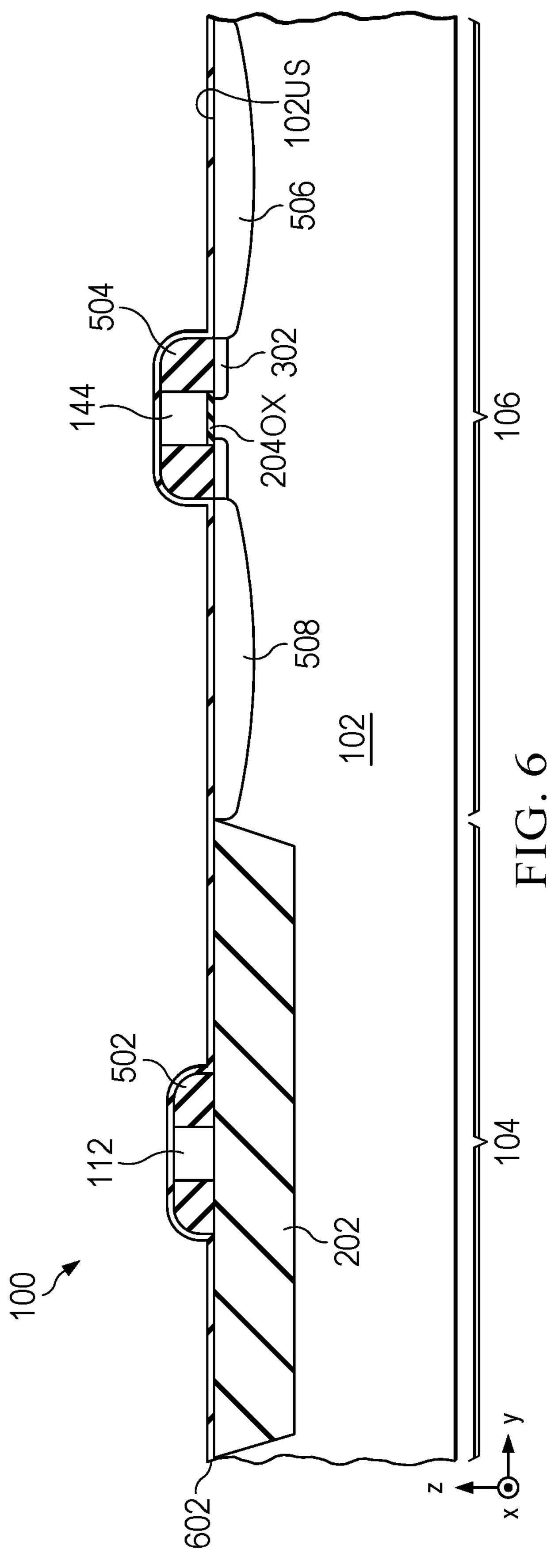

In FIG. 6, an etch stop layer 602 is formed, for example of silicon oxynitride (SiON) and by depositing it over the entire semiconductor device 100. The etch stop layer 600 may have a thickness selected from a range from 3 nm to 10 nm. In an example, the SiON is formed by a PECVD process utilizing silane ($SiH_4$), nitrous oxide ($N_2O$), helium (He), and a high-frequency radio-frequency (RF) power.

Figure 7A:
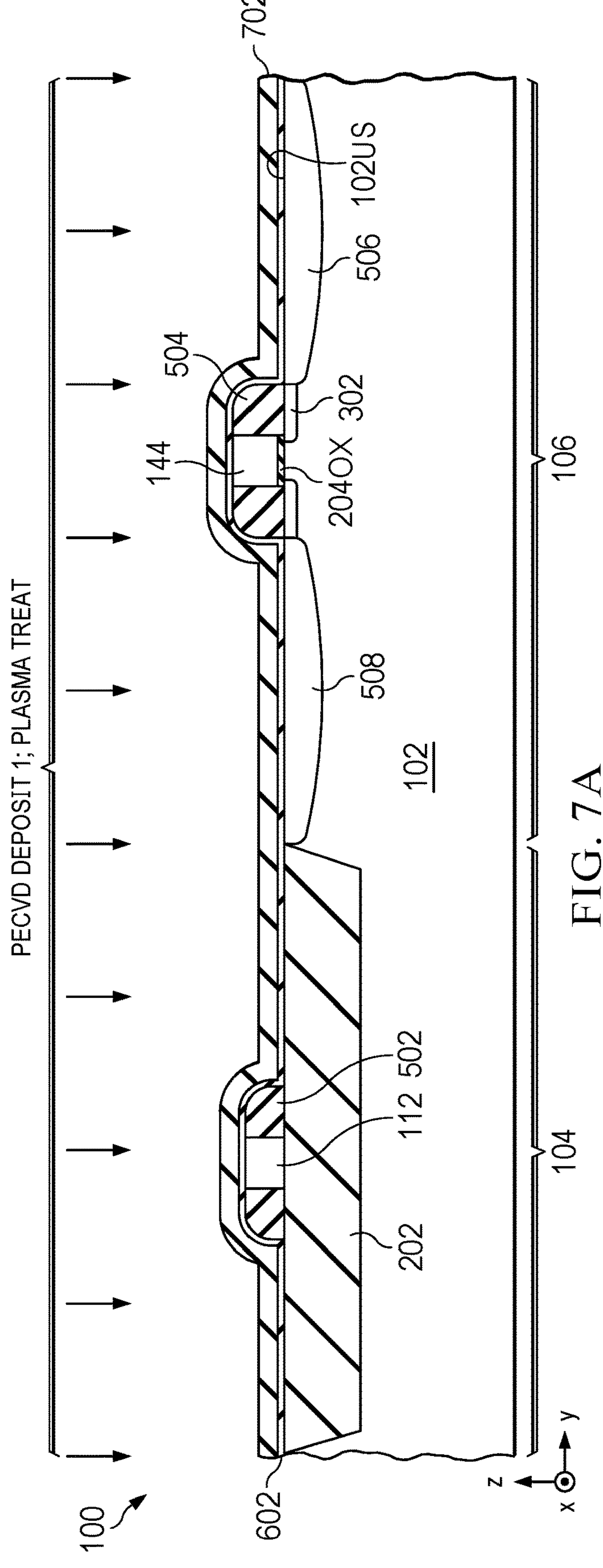
Figure 7B:
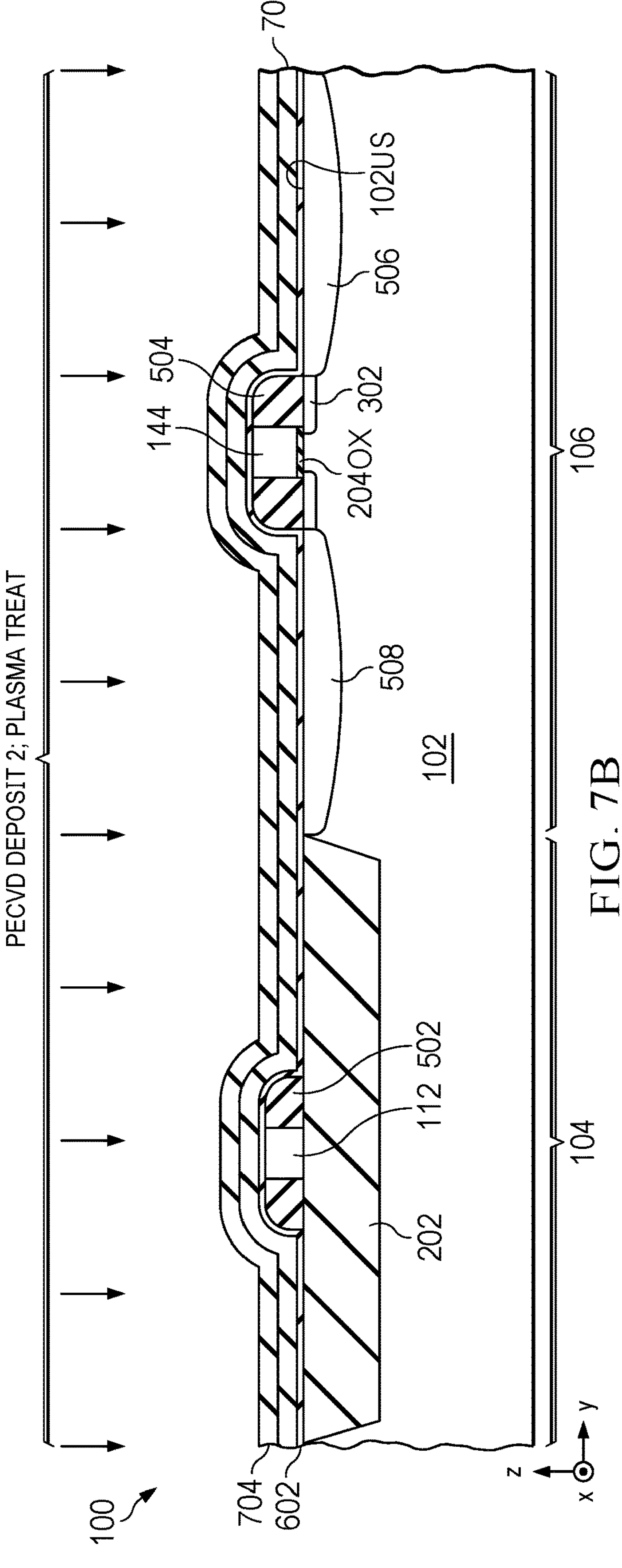
Figure 7C:
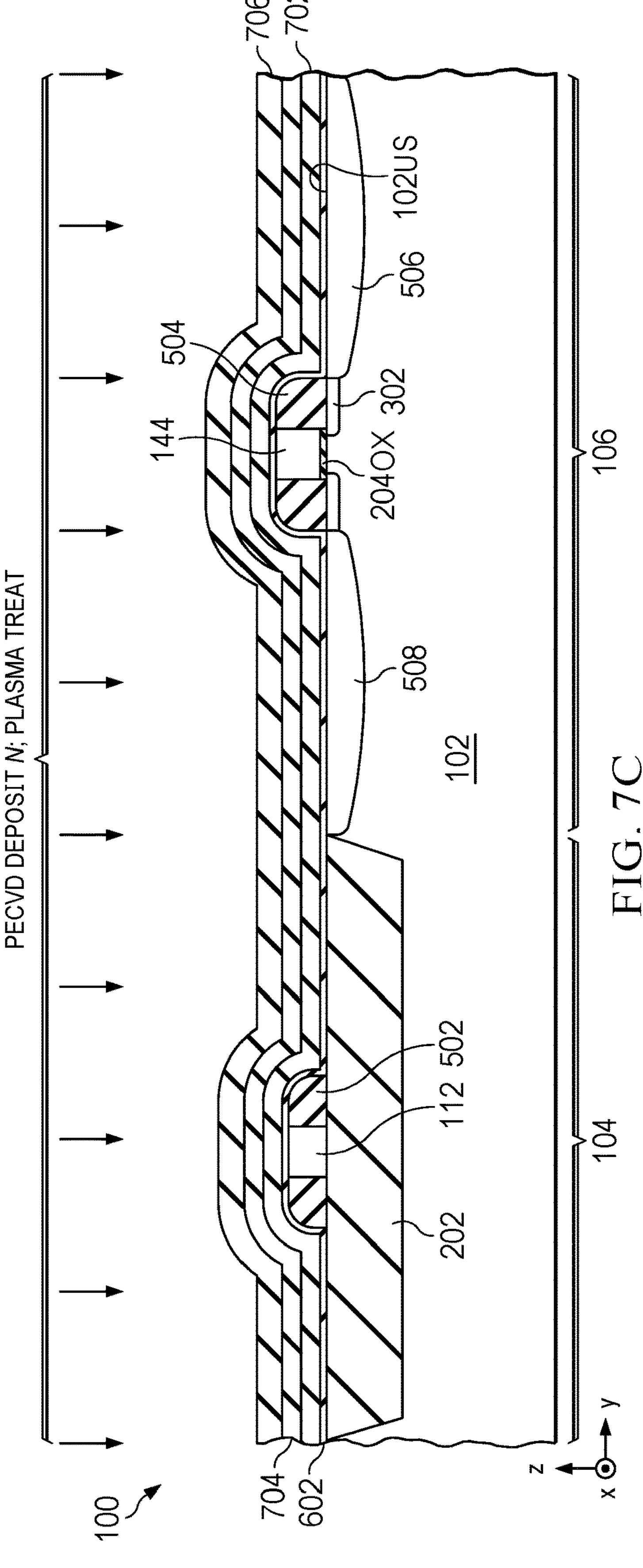

In each of FIGS. 7A-7C, a respective layer is formed toward creating the SiBLK 126, introduced earlier in FIG. 1, over portions of the polysilicon resistor body 112 (as ultimately shown in FIG. 8A). In the illustrated example of FIGS. 7A-7C, a total of N such layers are formed, in succession, combining to provide a cumulative layer that is subsequently etched to create the SiBLK 126, as further described below. Each of the N layers has a sufficiently high measure of conformality on both vertical (e.g., x-z plane) and horizontal (e.g., x-y plane) surfaces.

In FIG. 7A, a first SiBLK layer 702 is formed over an entirety of the illustrated structure and, accordingly, in both the resistor area 104 and the transistor area 106, and along the FIG. 6 etch stop layer 602. Accordingly, for each of the polysilicon resistor body 112 and the polysilicon transistor gate 144, the first SiBLK layer 702 is substantially conformal, while separated by the etch stop layer 602, to the sidewalls of each polysilicon structure (e.g., in the x-z plane) and to the horizontal surfaces each polysilicon structure (e.g., in the x-y plane). For example, the thickness of the first SiBLK layer 702 along the sidewalls of either polysilicon structure sidewalls is at least 75% of the thickness of the first SiBLK layer 702 along either polysilicon structure upper horizontal surface (presenting an overall conformality of 75% or greater). Further, in an example, the first SiBLK layer 702 is silicon nitride. Also in an example, the first SiBLK layer 702 is formed in a cycle that includes two steps. In a first step, the SiBLK layer 702 is deposited by chemical vapor deposition (CVD), and further by plasma enhanced CVD (PECVD), for example in a chamber temperature range from 350° C. to 550° C. and at an RF power in a range from 50 watts to 100 watts. The PECVD may use ammonia (NH3) as a nitrogen precursor and silane (SiH4) as a silicon precursor, with the plasma as a catalyst for reacting the gases and depositing the first SiBLK layer 702. The deposition thickness may be less than 2 nm, for example in a range from 1 nm to 2 nm. In a second step, the deposited layer is treated by ongoing exposure to the plasma with the inclusion of one or more noble gases, such as argon and/or helium, for a time period in a range from 10 seconds to 30 seconds. Other noble gases may include elements in the group 18 column of elements, including, e.g. neon, krypton and xenon. The treatment step is thought to further densify and improve the silicon/nitrogen bond in the first SiBLK layer 702. Also notably, a heat treatment below 30 seconds presents a materially reduced amount of heat load, either alone or also with the possibility of lower temperatures, as compared to a baseline formation of silicide blocking using a BTBAS process.

In FIG. 7B, a second SiBLK layer 704 is formed over an entirety of the illustrated structure and, accordingly, in both the resistor area 104 and the transistor area 106, and along the FIG. 7A first SiBLK layer. In an example, other than positioning, the second SiBLK layer 704 is formed in a same cycle manner as the first SiBLK layer 702. Accordingly, the second SiBLK layer 704 is PECVD deposited in a first step, and treated in a second step, in the same ranges described above. In an example, the particular values, within each range, are kept the same for each repeated cycle. Further, the second SiBLK layer 704 also achieves a desirable conformality (e.g., 75% or greater) comparable to that of the first SiBLK layer 702. The first and second SiBLK layers 702 and 704 thus aggregate with a combined thickness of each layer, for example of two 1.6 nm layers providing a total of a 3.2 nm silicon nitride layer.

In FIG. 7C, a final SiBLK layer 706 is formed over an entirety of the illustrated structure and, accordingly, in both the resistor area 104 and the transistor area 106, and along whatever prior-formed SiBLK layer has been formed, for a total of N SiBLK layers. The final SiBLK layer 706, as with the SiBLK layers between it and the etch stop layer 602, other than positioning, is formed in a same respective cycle manner as those prior layers. Accordingly, the final SiBLK layer 706 is PECVD deposited in a first step, and treated in a second step, in the same ranges described above. The value of N, that is the number of same deposition/treatment cycles desired, may be determined based on the target total thickness across all N layers, which combine to form a layer stack as part or all of the overall SiBLK structure. Further, each of the N SiBLK layers may achieve a desirable and comparable conformality (e.g., 75% or greater) and may present a detectable interface between it and an adjacent SiBLK layer.

Figure 8:
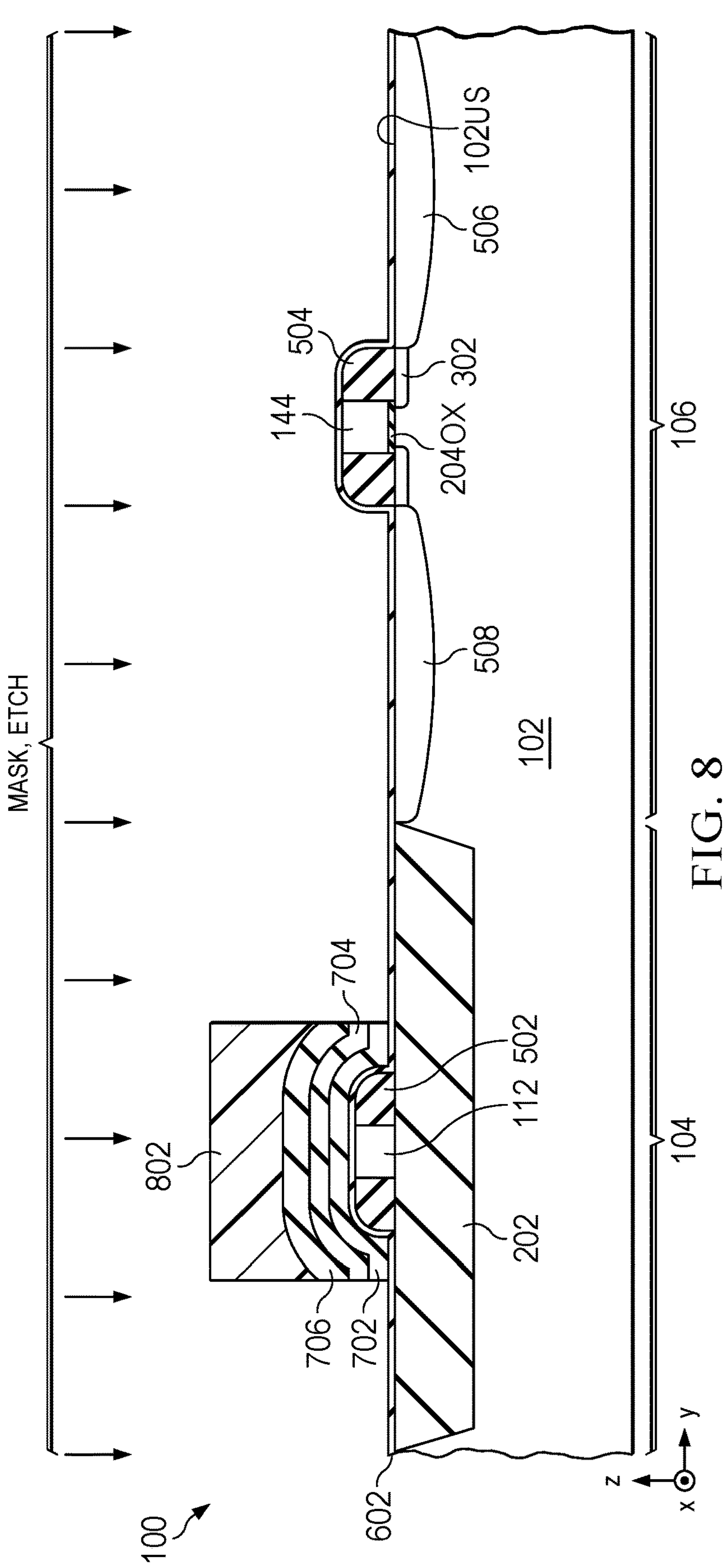

In FIG. 8, an etch mask 802 (e.g., photoresist) is formed over and across the stack of N SiBLK layers 702, 704, . . . , 706, from FIGS. 7A-7C. The shape and positioning of the etch mask 802 is to create a resulting SiBLK portion remaining over selective portions of the polysilicon resistor body 112, so as to correspond to the location of the FIG. 1 SiBLK 126. Next, a silicon nitride etch (e.g., dry etch) is performed down (in the z-dimension) to the etch stop layer 602, thereby removing portions of the SiBLK layers 702, 704, . . . , 706 in areas other than that masked by the mask 802.

Figure 9A:
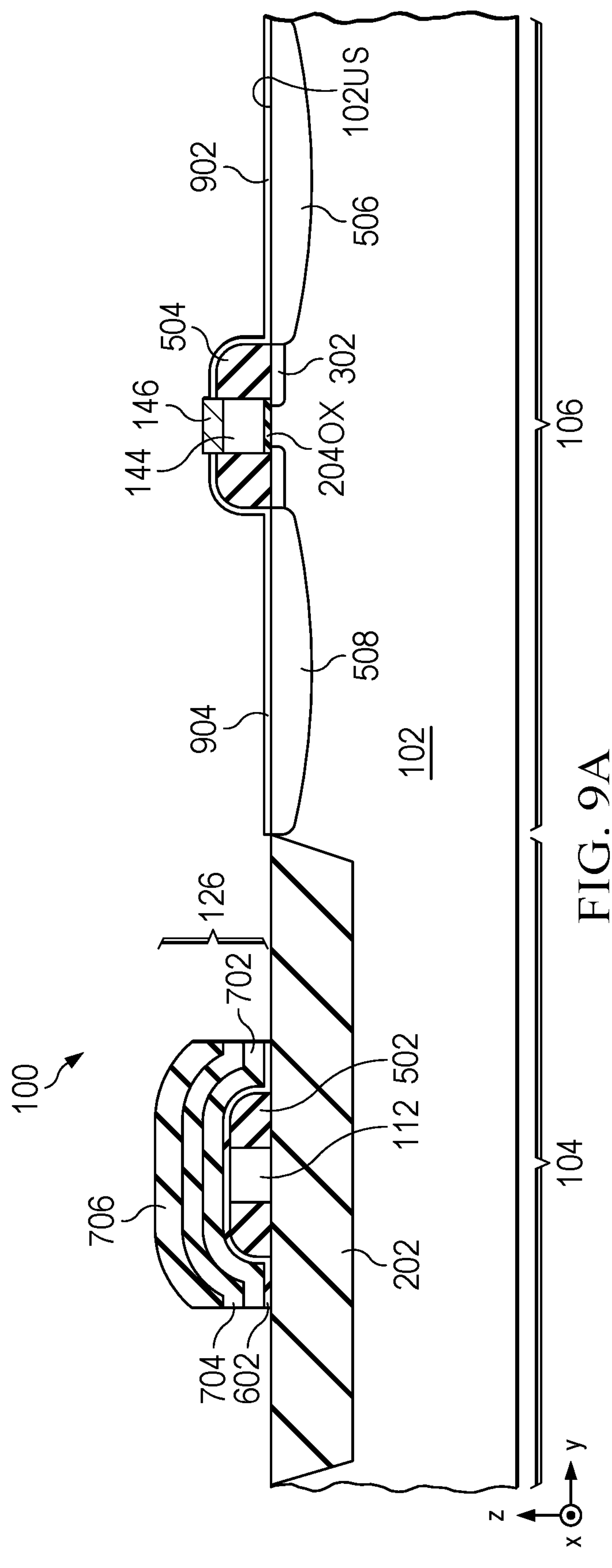
FIGS. 9A and 9B are cross-section views representing an additional fabrication stage and resultant structures, taken across different cross-sectional lines of the FIG. 1 semiconductor structure.
Figure 9B:
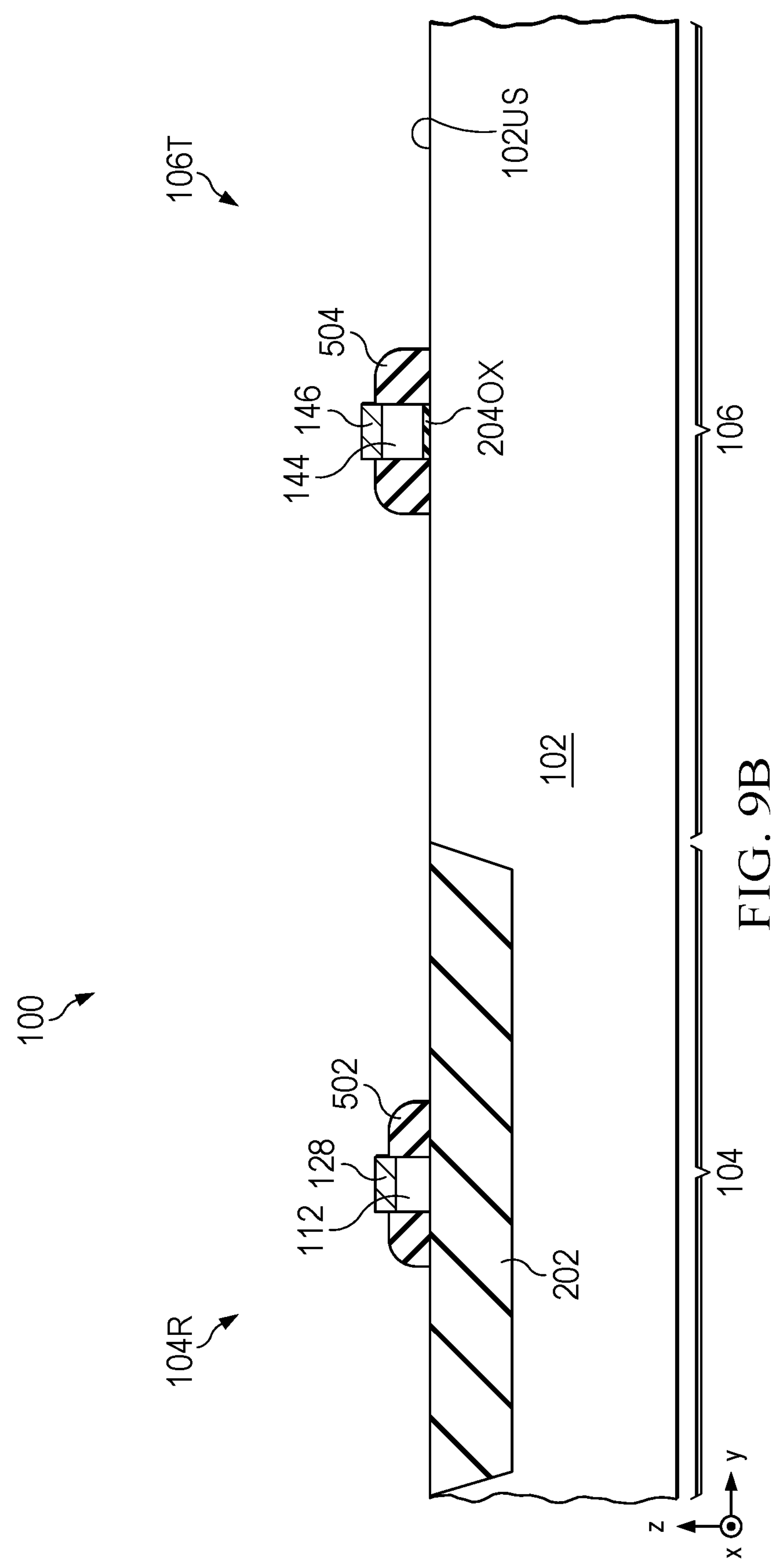

FIGS. 9A and 9B illustrate a result of a series of next steps, shown in cross section in the y-dimension at the locations shown in FIG. 1. Particularly, the portions of the etch stop layer 602 that remained after the FIG. 8 SiBLK etch are removed, for example using a wet etch. As one possible advantage of previously-described steps, the SiBLK 126 in FIG. 9A is particularly resistant to the wet etch, for example if that etch includes hydrofluoric acid. Accordingly, subsequent silicidation boundaries adjacent the SiBLK 126 may be improved due to the beneficial integrity of the SiBLK 126 in its resistance to the wet etch. Thereafter, the etch mask 802 is removed, for example using an ash etch. As a result, in FIG. 9A, the portions of the SiBLK layers 702, 704, . . . , 706 that were previously masked in FIG. 8 remain, while in FIG. 9B no such portions remain due to the absence of an etch mask in the position of the illustrated perspective. Further, the remaining SiBLK portions (from layers 702, 704, 706), cumulatively provide the FIG. 1 SiBLK 126. Accordingly, the silicide blocking function of the SiBLK 126 is only in selective positions of the polysilicon resistor body 112 and does not cover the polysilicon transistor gate 144, whereby exposed polysilicon surfaces provide areas where subsequent silicides are to be formed. Continuing in FIGS. 9A and 9B, a silicidation step is performed, thereby forming silicides on exposed polysilicon structures. Particularly, the FIG. 1 introduced gate silicide 146 is formed along the polysilicon transistor gate 144, while concurrently a first and second source/drain silicide 902 and 904 are formed along the first and second transistor source/drain regions 506 and 508, respectively. Meanwhile, the SiBLK 126, in the dimension shown in FIG. 9A, prevents silicidation of a portion of the polysilicon resistor body 112, while any portion of the polysilicon resistor body 112 not covered by the SiBLK 126, as shown in FIG. 1 in the x-y plane beyond the outer boundary of the SiBLK 126 and in FIG. 9B, will receive silicide; accordingly, FIG. 9B illustrates the addition of the FIG. 1 body silicide 128.

Figure 10:
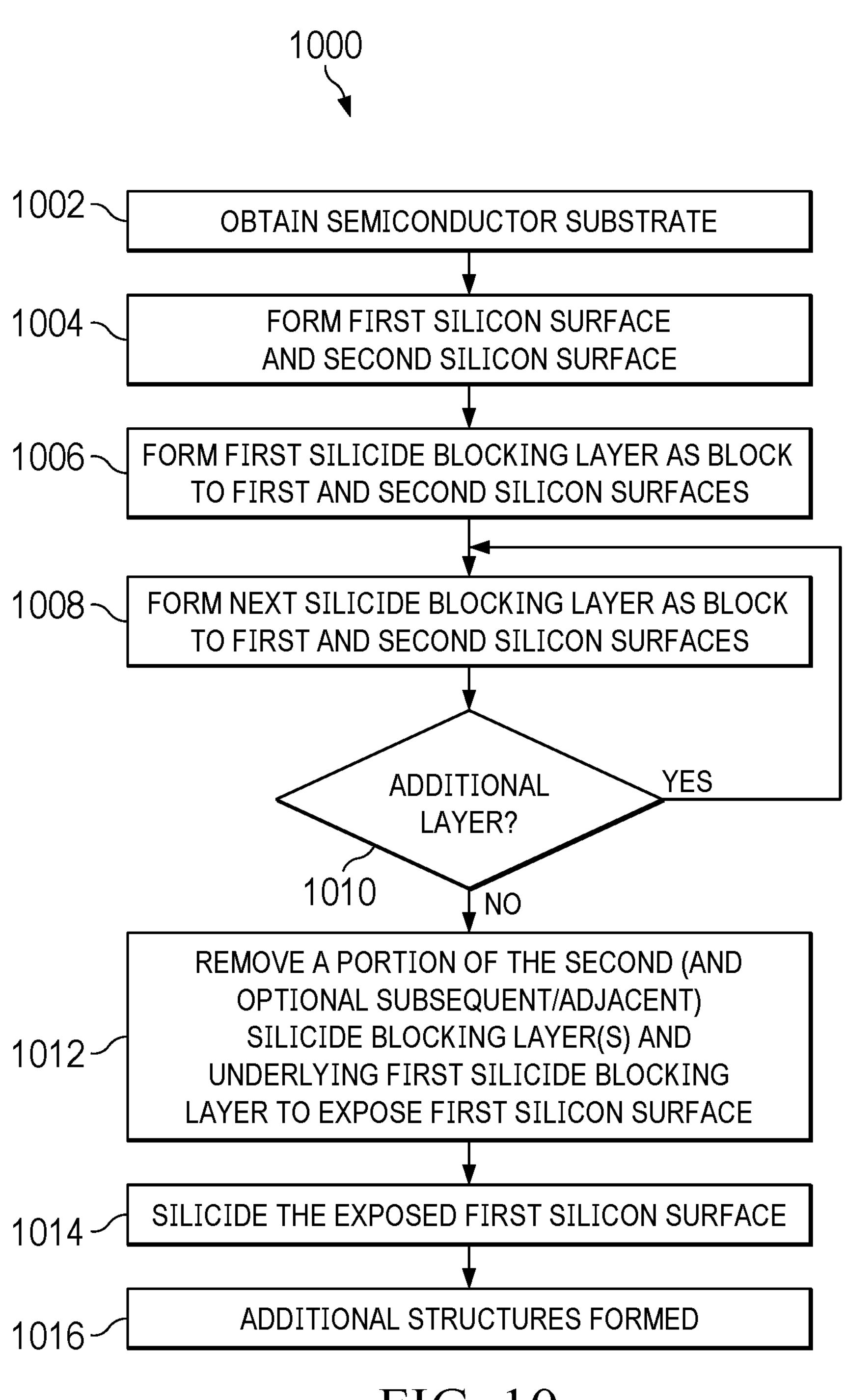
FIG. 10 is a flow diagram of an example method for manufacturing a semiconductor structure.

FIG. 10 is a flow diagram of an example method 1000 summarizing various of the above-described steps for manufacturing the semiconductor device 100, for example as shown in FIGS. 9A and 9B. The method 1000 begins in a step 1002, in which the FIG. 1 semiconductor substrate 102 is obtained. The semiconductor substrate 102, at this stage, may be a bare wafer or may have one or more semiconductor features already formed on it. The semiconductor substrate 102 also includes one or more areas, or on one or more electrical structures adjacent to such an area, in which it is desirable to form semiconductor or silicon including devices, for example such as the resistor 104R and the transistor 106T. Next, in a step 1004, a first silicon surface and a second silicon surface are formed. For, example, the first silicon surface may be a polysilicon transistor gate 144 or source/drain region 506 and 508, and the second silicon surface may be a resistor body 112. Next, in a step 1006, a first silicide blocking layer is formed relative to the first and second silicon surfaces. For example, the first silicide blocking layer may include the first SiBLK layer 702, alone or in combination with an etch stop layer (e.g., etch stop layer 602). Next in a step 1008, a next (e.g., second) silicide blocking layer is formed along the first silicide blocking layer. For example, the second silicide blocking layer may include the second SiBLK layer 704. Next, step 1010 determines if an additional silicide blocking layer is to be implemented and, if so, the method 1000 returns to the step 1008 and that next silicide blocking layer is formed along the preceding-formed silicide blocking layer. If step 1010 determines an additional silicide blocking layer is to be implemented, the method 1000 returns to step 1008, and otherwise proceeds to a step 1012. Accordingly, one or plural silicide block layers are formed, each including PECVD formation and noble gas exposure. In step 1012, a portion of the second (and any additional subsequent) silicide blocking layer(s), and an underlying portion of the underlying first silicide blocking layer, is removed to expose the first silicon surface while leaving at least the first silicide blocking layer over the second silicon surface. Next, in a step 1014, the step 1012 exposed first silicon surface is silicided. For example, the formed silicide may be the gate silicide 146 (or the body silicide 128 to the extent, if any, the resistor ends of the polysilicon resistor body 112 ends are exposed). Thereafter, a step 1016 generally represents that, after the step 1014, additional structures may be formed, in connection with the transistor, resistor, and interconnections to these and other devices associated with the step 1002 semiconductor substrate.

From the above, one skilled in the art should appreciate that examples are provided for semiconductor IC fabrication, for example with respect to an IC that includes devices in which silicide block structures are implemented, for example where both polysilicon resistors and other active devices, such as transistors, are included. Such examples provide various benefits, some of which are described above and including still others. Some examples may include silicide blocking structures using any one or more of lower temperatures, shorter exposure to heat cycles, reducing of chemical danger and cost, and sufficient layer conformality. As another example, one or more of the process variables (e.g., deposition power; treatment time, etc.) described herein may be tuned so as to adjust the layer stack attributes (e.g., thickness and HF wet etch rates), while still achieving acceptable structures and to fit specific device needs. Other benefits also may arise, including one or more of reduced layer defectivity and reduced fabrication cost (e.g., per wafer). Accordingly, while industry baseline processes could use other chemistries or recipe combinations, the present silicide block formation descriptions teach away from, or provide an alternative to, combination(s) arising from possible industry inertia or practice goals, providing an alternative and often sufficiently comprehensive advantage set for particular IC implementations. Indeed, as IC size reduces, baseline approaches may incur other issues, for example in the formation of undesirable layer shapes (e.g., bread loafing) between closely spaced polysilicon structures, for example in geometry spacing, between adjacent polysilicon structures, at 65 nm or below. The present teachings also may prove more favorable in such tighter spatial applications. Still additional modifications are possible in the described examples, and other examples are possible, within the scope of the following claims.

What is claimed is:

1. A method of forming an integrated circuit, comprising:

forming a first silicon surface;

forming a second silicon surface;

forming a first silicide blocking layer along the first silicon surface and along the second silicon surface;

forming a second silicide blocking layer along the first silicide blocking layer, wherein forming each of the first silicide blocking layer and the second silicide blocking layer includes:

forming a plasma enhanced chemical vapor deposition (PECVD) layer; and exposing the PECVD layer to a noble gas for a time duration;

removing a portion of the second silicide blocking layer and an underlying portion of the first silicide blocking layer to expose the first silicon surface while leaving at least the first silicide blocking layer over the second silicon surface; and after the removing step, siliciding the first silicon surface.

2. The method of claim 1, wherein the first silicon surface includes a transistor gate or source/drain region and the second silicon surface includes a resistor body.

3. The method of claim 2, wherein the transistor gate has a width of 65 nm or less.

4. The method of claim 1, wherein each of the first and second silicide blocking layers has a same thickness.

5. The method of claim 4, wherein the same thickness is in a range from 10 Å to 20 Å.

6. The method of claim 1, further including forming an integer number N of successive silicide blocking layers relative to the second silicide blocking layer, wherein each layer in the successive silicide blocking layers is formed along a respective and previously formed one of either the second or another of the successive silicide blocking layers.

7. The method of claim 6, wherein each of the first and second silicide blocking layers, and the integer number N of successive silicide blocking layers, has a same thickness.

8. The method of claim 7, wherein the same thickness is in a range from 10 Å to 20 Å.

9. The method of claim 1, wherein the noble gas is selected from a group consisting of argon and helium.

10. The method of claim 1, wherein the time duration is in a range from 1 second to 20 seconds.

11. The method of claim 10, wherein each of the forming a PECVD layer and exposing the PECVD layer steps occurs in a chamber with a temperature in a range between 350° C. and 550° C.

12. The method of claim 1, wherein the removing step includes removing the portion using hydrofluoric acid.

13. The method of claim 1, wherein each of the first and second silicide blocking layers includes silicon nitride.

14. The method of claim 1, wherein each of the first and second silicide blocking layers has a conformality of at least 75%.

15. A method of forming an integrated circuit, comprising:

forming a plurality of silicide blocking layers over a first silicon surface and a second silicon surface, by a process, for each of the silicide blocking layers, that includes depositing a respective layer by plasma enhanced chemical vapor deposition and then exposing the respective layer to a noble gas for a time duration;

removing a portion of one or more of the plurality of silicide blocking layers to expose the first silicon surface while leaving the second silicon surface blocked by the plurality of silicide blocking layers; and siliciding the first silicon surface.

* * * * *